US010500499B1

United States Patent
Wencel et al.

(10) Patent No.: US 10,500,499 B1
(45) Date of Patent: Dec. 10, 2019

(54) METHOD AND APPARATUS FOR PROVIDING A RESOURCE CONFINED SIMULATION BASED ON PROJECTED DATA IN LIGHT OF HISTORICAL FACTS

(71) Applicant: MEDIA ALLIANCE GAMING STUDIO, INC., San Jose, CA (US)

(72) Inventors: Lucian Daniel Wencel, San Jose, CA (US); Hannah Samira, Jerusalem (IL)

(73) Assignee: MEDIA ALLIANCE GAMING STUDIO, INC., San Jose, CA (US)

( * ) Notice: Subject to any disclaimer, the term of this patent is extended or adjusted under 35 U.S.C. 154(b) by 0 days.

(21) Appl. No.: 16/249,764

(22) Filed: Jan. 16, 2019

(51) Int. Cl.
*A63F 13/65* (2014.01)
*A63F 13/56* (2014.01)
*G06F 16/909* (2019.01)
*G06F 16/9035* (2019.01)
*G06F 17/50* (2006.01)

(52) U.S. Cl.
CPC ............. *A63F 13/65* (2014.09); *A63F 13/56* (2014.09); *G06F 16/909* (2019.01); *G06F 16/9035* (2019.01); *G06F 17/5009* (2013.01)

(58) Field of Classification Search
CPC ........ A63F 13/65; A63F 13/56; G06F 16/909; G06F 16/9035; G06F 17/5009
USPC ............................................................ 463/1
See application file for complete search history.

(56) References Cited

U.S. PATENT DOCUMENTS

| 5,261,820 A | * | 11/1993 | Slye | ........................ A63F 13/10 |
| | | | | 273/237 |
| 2004/0048643 A1 | * | 3/2004 | Lauter | ..................... A63F 13/10 |
| | | | | 463/1 |
| 2007/0207846 A1 | * | 9/2007 | Burak | ..................... A63F 13/10 |
| | | | | 463/9 |

* cited by examiner

*Primary Examiner* — Allen Chan
(74) *Attorney, Agent, or Firm* — Intellectual Property Law Group LLP

(57) ABSTRACT

A resource confined simulation ("RCS") is a user interactive simulation-based system using at least a portion of historical event via a communications network. The RCS system is able to establish a historical based information system for emulating RCS. After identifying a historical event in accordance with recorded historical facts for creating an environment to simulate an RCS, the RCS system generates a map as a geographic parameter associated with the RCS in accordance with historical geography relating to the historical event. Upon generating armed force as a military parameter associated with the RCS in accordance with the historical event, a map storage is used to store the map related parameters and an armed force storage for storing the armed force related parameters. The RCS system is able to emulate the RCS in response to various parameters such as the map, armed force, and/or the user input.

12 Claims, 8 Drawing Sheets

METHOD AND APPARATUS FOR PROVIDING A RESOURCE CONFINED SIMULATION BASED ON PROJECTED DATA IN LIGHT OF HISTORICAL FACTS

FIELD

The exemplary embodiment(s) of the present invention relates to the field of computer hardware and software. More specifically, the exemplary embodiment(s) of the present invention relates to computer simulation or video games.

BACKGROUND

Video games and/or interactive real-time computing based games are generally played on various types of electronic systems. For example, systems can be connected by a network such as Internet for real-time interactive playing. Typical electronic systems which can host video games or interactive games include laptop computers, desktop computers, handheld portable devices, and/or video game consoles, such as PlayStation 4, Xbox One, and/or Nintendo Switch. The hardware and/or software capable of hosting conventional video games is typically relating to fictitious stories with no limited real values.

A drawback associated with a conventional video game operated by a typical electronic system is that it generally lacks values such as education and/or teaching values.

SUMMARY

A resource confined simulation ("RCS") is a user interactive simulation-based system using at least a portion of historical event via a communications network. The RCS system, which includes a digital processor, memory, and network communication transceiver, is able to establish a historical based information system for emulating RCS. After identifying a historical event in accordance with recorded historical facts for creating an environment to simulate an RCS, the RCS system generates a map as a geographic parameter associated with the RCS in accordance with historical geography relating to the historical event. Upon generating armed force as a military parameter associated with the RCS in accordance with the historical event, a map storage is used to store the map related parameters and an armed force storage for storing the armed force related parameters. The RCS system is able to emulate the RCS in response to various parameters such as the map, armed force, and/or the user input.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
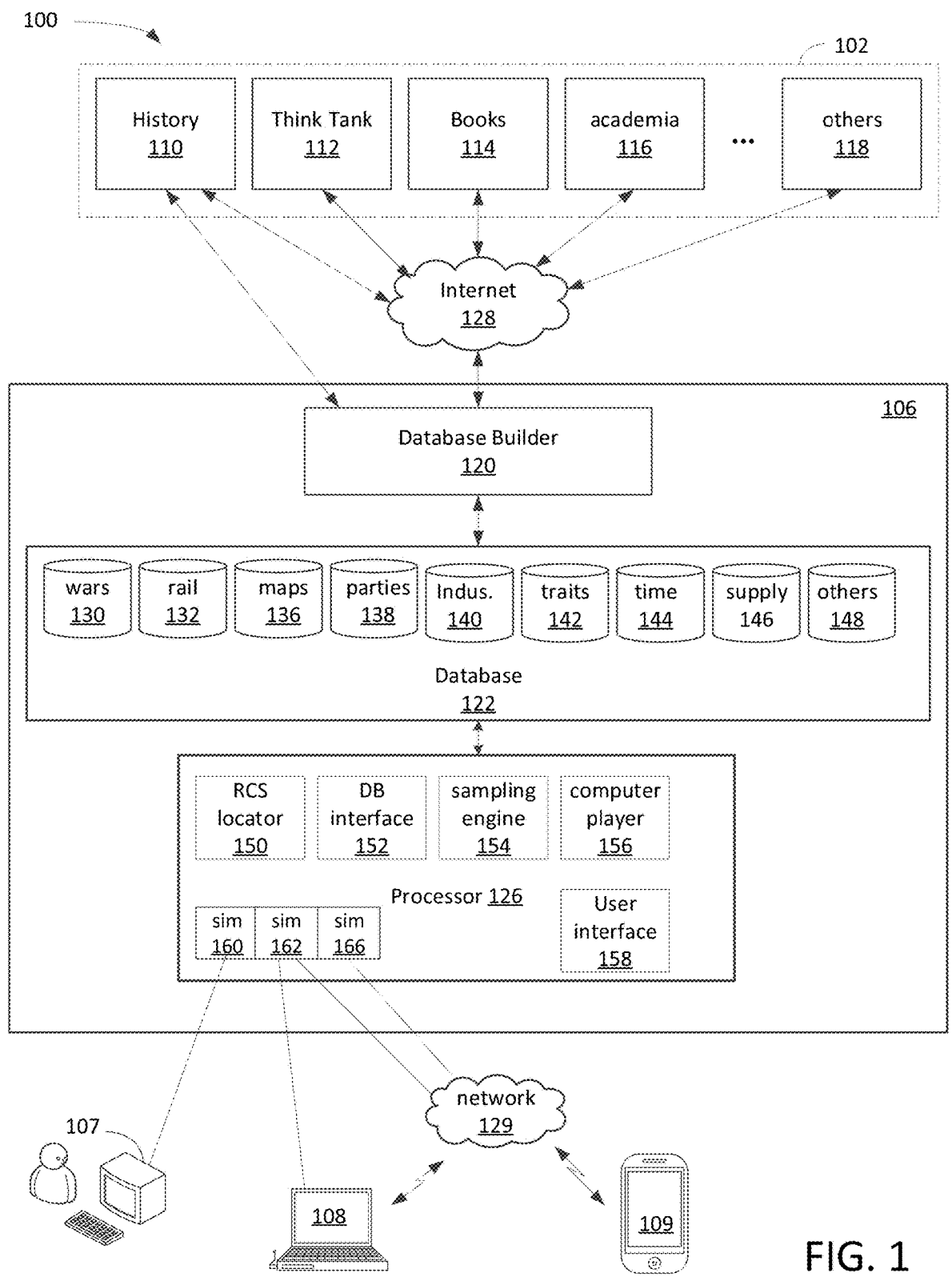
FIG. 1 is a block diagram illustrating a resource confined simulation ("RCS") system for emulating a sequence of events in accordance with at least in-part on the historical events in accordance with one or more embodiments of the present invention.

Embodiments of the present invention are described herein with context of a method and/or apparatus for facilitating resource confined simulation ("RCS") such as computer games, video games, and/or educational program based on certain historical background and/or events.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the present invention discloses a process or RCS system capable of emulating RCS which may also be referred to as a video game(s) or computer game(s). The RCS system can be a user interactive simulation-based system using at least a portion of historical event via a communications network. The RCS system, which includes a digital processor, memory, and network communication transceiver, is able to establish a historical based information system for emulating RCS. After identifying a historical event in accordance with recorded historical facts for creating an environment to simulate an RCS, the RCS system generates a map as a geographic parameter associated with the RCS in accordance with historical geography relating to the historical event. Upon generating armed force as a military parameter associated with the RCS in accordance with the historical event, a map storage is used to store the map related parameters and an armed force storage for storing the armed force related parameters. The RCS system is able to emulate the RCS in response to various parameters such as the map, armed force, and/or the user input.

FIG. 1 is a block diagram 100 illustrating an RCS system capable of emulating a sequence of events in accordance with at least in-part on the historical events in accordance with one or more embodiments of the present invention. Diagram 100 includes input data 102, RCS system 106, and users 107-109. In one aspect, diagram 100 also includes communications networks 128-129 used for coupling input data 102, RCS system 106, and users 107-109. It should be noted that the underlying concept of the exemplary embodiment(s) of the present invention would not change if one or more blocks (or networks) were added to or removed from diagram 100.

Input data 102, in one embodiment, provides data or information for building a database such as database 122 which will be used to emulate RCS. Input data 102, in one aspect, includes historical data 110, data from think tank 112, recordings from books 114, information from academia 116, and others 118 wherein historical data 110, for example, records or recounts various historical facts and/or events. Such historical data 110 can be generated by historians, museum records, scholars' papers, peoples' recollections from both sides, and the like. In one aspect, historical data 110 is used to emulate an actual historical event(s) during RCS.

Information and/or data from thank tank or foundations 112 can also be part of input data 102 for establishing the database such database 122 for simulation. For example, think tank 112 such as Hoover Institution or Brookings Institution generates think-tank data including, but not limited to, various opinions, geopolitics, and/or predications based on the historical and/or geopolitical data at the time of the event. It should be noted that the think-tank data can also be used to project or predict alternative outcomes instead of actual historical outcomes during hosting of RCS.

Book information 114 includes data from memoirs, documentary movies, articles, and/or books. For example, book information 114 can include recounting of historical events, hypothetical results, or predications of alternative outcomes. In one aspect, book information 114 can be used for both actual historical simulation and alternative simulation for RCS.

Academia studies or papers 116, such as university thesis, essay, dissertation, and/or treatise, can also be used as input data 102. For example, academia papers 116 can be used to refine historical facts, hypothetical alternative outcomes, or missing facts. In one aspect, academia papers 116 can be used for both actual historical simulation and alternative possible outcomes. It should be noted that other information or data such as race, culture, tradition, public sentiment, and/or resolutions from the United Nations, can also be used as input data 102 for emulating RCS.

RCS system 106, in one embodiment, includes a database builder 120, database 122, and processor 126. Database 120 is configured to establish database 122 based on input information 102 for facilitating RCS. Processor 126 is used to facilitate RCS based on parameters stored in database 122 as well as the user inputs. While database builder 120 is responsible to build database 122 from input data 102 via a communications network such as Internet 128, processor 126 employs multiple simulators 160-166 used for interfacing with users 107-109.

Database builder 120, in one embodiment, employs a preloading method, dynamic loading method, or a combination of preloading and dynamic loading method. The preloading method, for example, is a process of building database 122 before an RCS can be simulated. After building of database 122, a user such as user 107 can activate the RCS for simulation. It should be noted that the building process can be automatic based on RCS and the data stored in database 122 using various processes, such as artificial intelligence ("AI"), machine learning ("ML"), manual input, and/or a combination of AI, ML, and manual input.

Alternatively, the dynamic loading, also known as on-demand data building, is a method which is used by database builder 120 or establish necessary data or parameters from a cloud-based RCS network in real-time. For example, upon recognizing that the selected RCS contains no or insufficient data or parameters, database builder 120 is able to search and download necessary information or data to start the selected RCS. Depending on the user input(s), database builder 120 can dynamically build necessary database or parameter to facilitate the selected RCS.

The method of both preloading and dynamic loading can be implemented for certain RCSs. A benefit of using dynamic loading or the combination of preloading and dynamic loading is to save storage space and update the latest information while emulating RCS.

Database 122, in one embodiment, stores various types of data and/or parameters, such as, but not limited to, wars 130, rails 132, maps 136, parties or contries 138, industrial capacity 140, culture traits 142, time duration 144, supply/transportation capabilities 146, and/or others 148. Database 122 can be divided or organized into multiple sub-storage sections such as tables or blocks for storing data 130-148. Depending on the applications and/or RCSSs, database 122 can store additional information, such as total population, public sentiment/opinions, world sentiment/opinions, armed force, international supports, and the like. In one example, database 122 can be further organized to store detailed information, such as battalions of armed force, number of warships, number of warplanes, number of tanks, artillery pieces, missiles, chemical weapons, and the like. A function of database 122 is to provide data or information as parameters to processor 126 for facilitating outcome calculation(s).

Processor 126 includes an RCS locator 150, database interface 152, sampling engine(s) 154, computer player 156, user interface 158, and user simulators 160-166. It should be noted that it does not change the scope of processor 126 if additional circuitry or blocks are added or removed. While DB interface 152 is used to communicate with database 122, user interface 158 is used to communicate with users 107-109 via user simulators 160-166. A function of processor 126 is to emulate RCS which can also be referred to as video game(s) and/or interactive war education(s) to produce intermediary or final outcome(s). To simplify forgoing discussion, the term "RCS" will be used in place of video games and/or interactive war educations.

RCS locator 150, in one embodiment, is used to identify one of many simulations or games to play based on the user input. For example, a user such as user 107 can enter a selection of an RCS to play via user simulator 160. Based on user's selection, RCS locator 150 searches through database 122 to locate or identify whether such game or RCS is in the database. Upon allocating the RCS, RCS locator 150, in one aspect, informs processor 126 that the RCS is identified and located. Before activating the selected RCS or game, processor 126 initializes various storage locations and/or tables to load necessary parameters from database 122 for starting to emulate RCS. For example, upon detecting a user input of user 107 selecting RCS of 1973 Middle-East war, RCS locator 150 searches database 122 to identify any data related to 1973 Middle-East war, Yom Kippur War, Ramadan War, October War or the 1973 Arab-Israeli War. Upon verifying that the data is available for selected RCS, processor 126 begins to emulate Yom Kippur War based on the identified data.

Sampling engine 154, in one embodiment, is an RCS engine using one or more statistic algorithms such as Monte Carlo's methods to calculate a battle result or outcome. For example, sampling engine 154 is capable of calculating one or more outcomes based on parameters loaded from database 122. A function of sampling engine 154 is to calculate or project an outcome based on user input(s) as well as various parameters, such as strength of armed force, warplanes, warships, missiles, tanks, supply lines, and the like. Note that Monte Carlo's method is an algorithm using repeated random sampling to obtain numerical results in light of optimization, numerical integration, and probability distribution.

User interface 158 facilitates communication between user simulators 160-166 with processor 126. User simulators 160-166 are used to communicate with users via direct connection such as between user 107 and user simulator 160. Also, user simulators can communicate with users 108-109 via network 129. Depending on the applications, user simulator 162 can connect to user directly or indirectly via a network 129. A function of user simulators such as simulator 160 is to provide an interface between RCS system 106 and users 107-109.

Users 107-109, in one example, can be persons, players, machines, servers, institutions, military trainees, law enforcement trainees, and the like. In one aspect, user such as user 107 is required to enter selections to progress the selected RCS. User can either play RCS with another user or with computer player 156. Note that two remotely situated users can play with each other via a communications network such as network 129.

In one embodiment, RCS system 106 includes user controllers such as user simulators 160-166, a map database such as maps 136, an armed force database such as parties 138, and a digital processor such as processor 126 for facilitating RCS based on at least a portion of the historical events. The user controllers, for example, is able to receive user inputs via one or more user connected consoles for simulating RCS. While the map database stores a map representing a geography associated with the RCS in accordance with historical geography relating to an actual event, the armed force database stores the armed force as a military parameter associated with the RCS in accordance with the historical data. The digital processor generates numerical results or outcomes based on repeated random sampling. Note that the digital processor such as RCS system 106 is able to emulate RCS utilizing numerical or intermediary results in response to the map, armed force, and user input.

In one aspect, database 122 includes a party database configured to store data relating to a party involved in the historical event. In one example, RCS system 106 provides a culture characteristic database configured to store data relating to a culture trait based on the historical event. To emulate the RCS, a rail database stores a set of logic flow sequences wherein one of the sequences represents a historic rail and another portion of the sequences may represent another optional rail. A rail includes a set of multiple sequential blocks or events wherein the events are happened in a sequential order according to a time domain. A database controller such as database builder 120 is able to obtain and establish a set of data streams based on at least a portion of the historical events for facilitating RCS.

An advantage of employing RCS system is that it can provide educational teaching as well as entertainment. In addition, RCS system can also predict alternative likely outcomes had certain facts altered.

Figure 2:
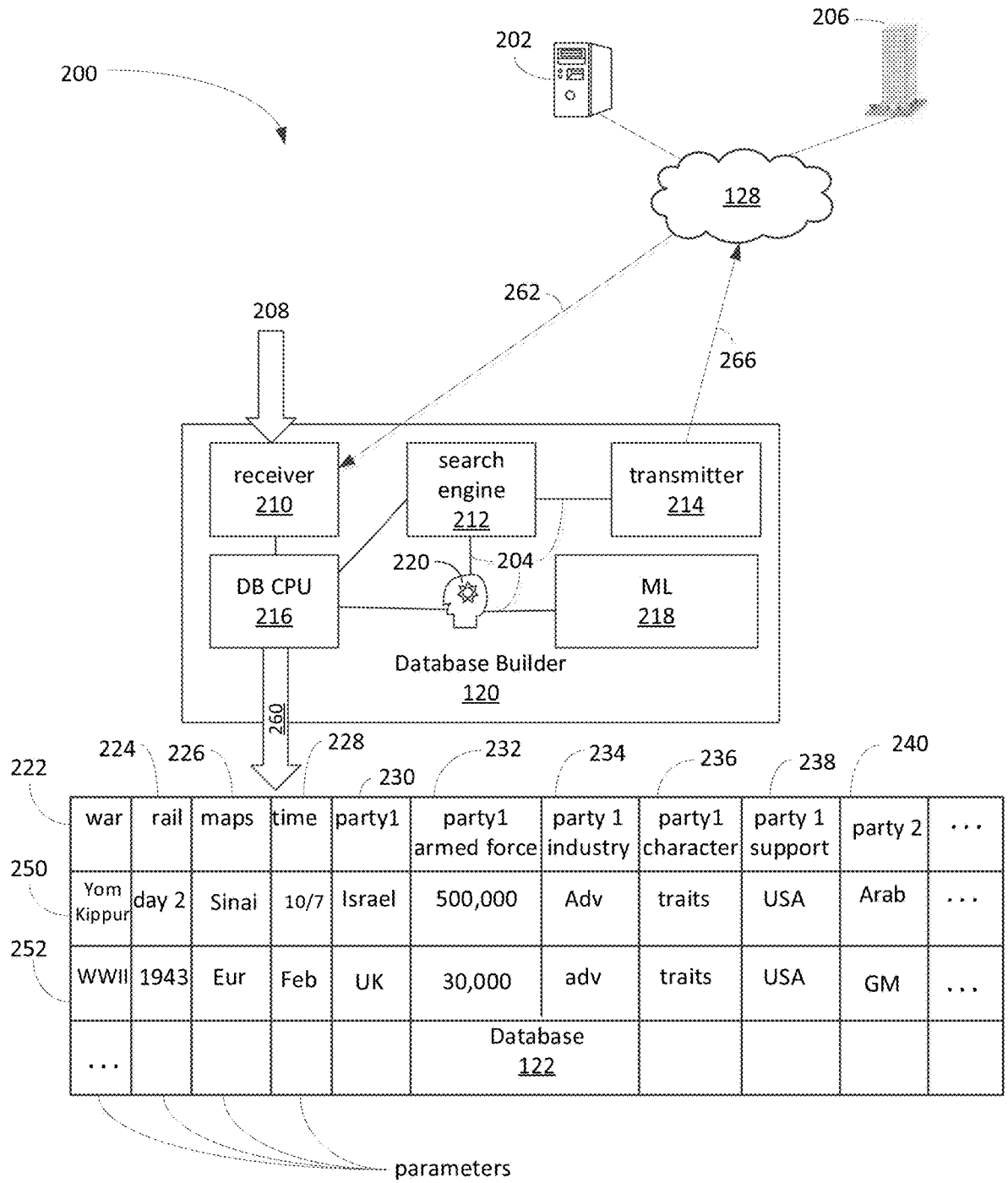
FIG. 2 is a block diagram illustrating a detailed database builder and database in accordance with one or more embodiments of the present invention.

FIG. 2 is a block diagram 200 illustrating a detailed database builder 120 and database 122 in accordance with one or more embodiments of the present invention. Diagram 200 includes database builder 120, database 122, remote server 202, remote content provider 206, and Internet 128. Database builder 120 further includes a receiver 210, search engine 212, transmitter 214, AI component 220, ML component 218, and DB CPU 216. It should be noted that the underlying concept of the exemplary embodiment(s) of the present invention would not change if one or more blocks (or networks) were added to or removed from diagram 200.

A function of database builder 120 is to build a database 122 to support emulation of RCS. Builder 120, in one embodiment, employs a preloading method in which receiver 210 obtains data and/or information either from a manual input 208 or network input via Internet 128 as indicated by numeral 262. The preloading method facilitates establishing database 122 before RCS can be emulated. Depending on the applications, DB CPU (central processing unit) 216 builds database 122 via internal bus 260 in accordance with data from receiver 210. To build database 122, the preloading method can also use AI 220 which manages search engine 212 and transmitter 214 via internal connections 204 to search and obtain relevant information from server 202 and/or content provider 206 via Internet 128. ML 218 is subsequently activated to learn and refine searching capabilities based on obtained data in light of RCS. For instance, the preloading method can use both manual input 208 and IA input to build and verify information stored in data base 122.

Database builder 120 can also be configured to perform a method of dynamic loading, also known as on-demand data building, wherein database 122 stores basic data, parameters, or tables when an RCS begins. DB CPU 216 activates AI 220 to obtain necessary data or parameters from a cloud-based RCS network in real-time wherein the necessary data or parameters contain sufficient information for the current and the next turn or move of RCS based on user input. For example, upon recognizing that the selected RCS contains insufficient data or parameters, database builder 120 is able to search and download necessary information or data from the cloud-based RCS network whereby the necessary data will enable to start of selected RCS. Upon modification of search terms by ML 218, transmitter 214, for example, transmits the modified search terms to the cloud-based RCS network via Internet 128. Once the data is obtained and verified by ML 218 and/or AI 220, database 122 is updated accordingly to facilitate the next turn of RCS. The term "turn" or "next move" refers to the process of RCS moving from one phase (block or event) to next phase (block or event) within a rail. A benefit of employ the dynamic loading method for database builder 120 is to provide more RCSs or games with the minimal requirement of local storage capacity.

Database 122, in one embodiment, stores various types of data and/or parameters for multiple RCSs. For example, database 122 stores information or parameters relating to wars 222, rails 224, maps 226, time 228, party1 or country1 230, armed force 232, industrial capacity 234, characters or culture traits 236, support 238, party2 230, and the like. Database 122 includes various wars or war theaters such as Yom Kippur 250 and/or WW II (World War Two) 252. For example, war of Yom Kippur 250 has rail parameter of day 2, map parameter of Sinai, time parameter of Oct. 7, 1973, party1 parameter of Israel, armed force parameter for party1 is 500,000, party1 industry parameter of advanced, party1 character parameter of trait 1, party 1 support parameter of USA, party2 of Arab countries, and the like. In one aspect, database 122 can store additional information, such as, but not limited to, total population, public sentiment/opinions, world opinions/resolutions, international supports, battalions of arm, warships, warplanes, tanks, artillery pieces, missiles, chemical weapons, and the like. A function of database 122 is to provide data or information as parameters to facilitate RCS such as Yom Kippur War day 2.

Figure 3:
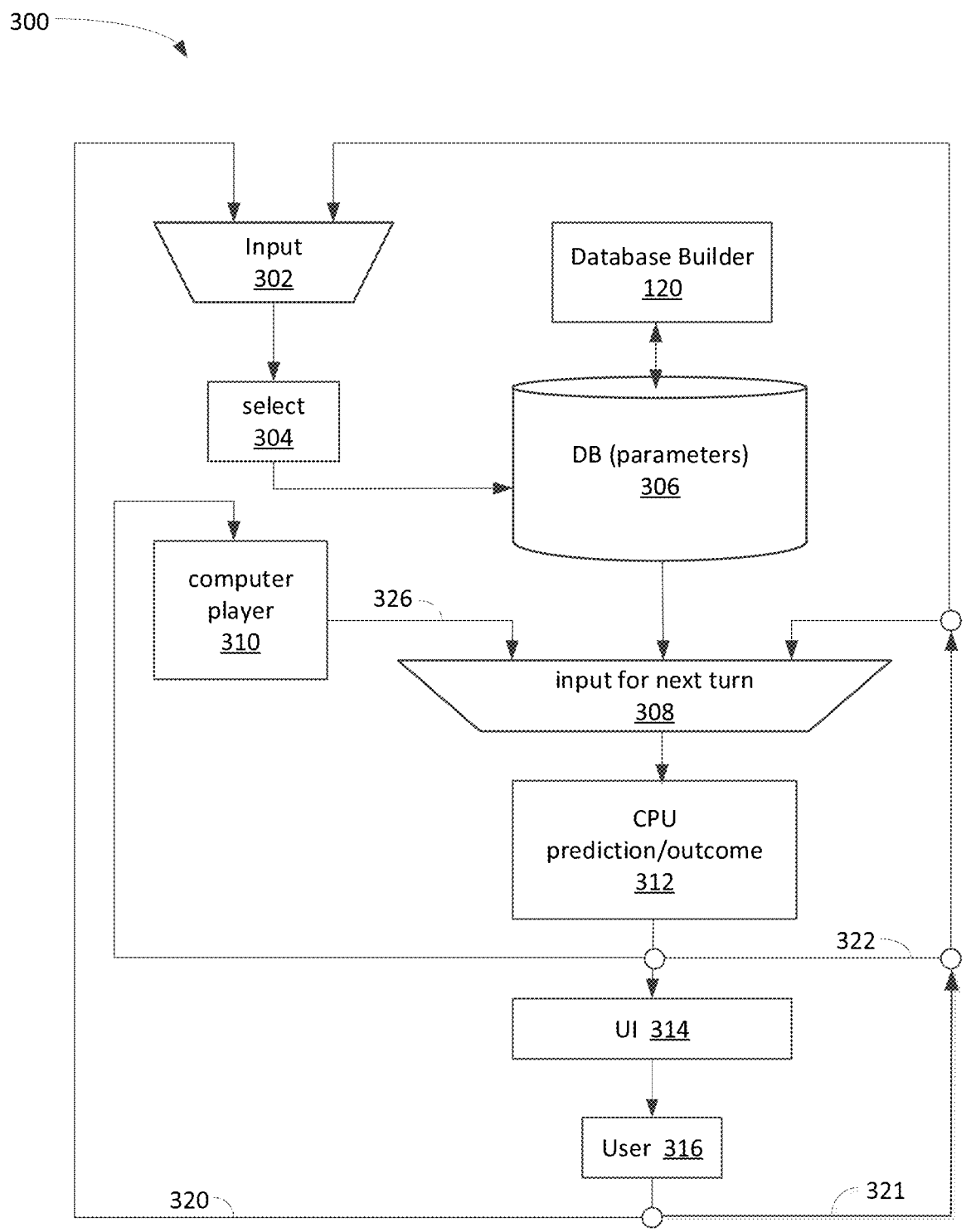
FIG. 3 is a logic block diagram illustrating an exemplary process of emulating RCS in accordance with established parameters in accordance with one or more embodiments of the present invention.

FIG. 3 is a logic block diagram 300 illustrating an exemplary process of emulating an RCS in accordance with established parameters in accordance with one or more embodiments of the present invention. Diagram 300 includes a database builder 120, DB 306, CPU 312, and user 316. Database builder 120, in one example, generates objects that are predefined by the nature of RCS and stored in DB 306 as parameter(s). For instance, if RCS is WWII, time duration parameter is predefined to between 1939 to 1945. It should be noted that the underlying concept of the exemplary embodiment(s) of the present invention would not change if one or more blocks (or networks) were added to or removed from diagram 300.

To initiate a selected RCS, user 316 is usually required to enter a set of player defined objects as indicated by numeral 320. For example, user 316 can select USA as a party1 parameter. After receipt of user input at input device 302, select module 304 identifies and stores user or player defined objects at DB 306 as parameters. Upon receiving inputs from user input 321, parameters from DB 306, and selections from computer player 310, input component 308 processes and passes processed inputs to CPU 312 for calculation. CPU 312, which provides action spontaneous random processing, initiates and processes game events autonomously using algorithms such as Monte Carlo method without players' input.

UI 324 is used to communicate with user 316. For example, UI 324 can be a computer terminal, computer monitor, smart phone, and/or portable pad capable of providing interface between user 316 and CPU 312. In one aspect, CPU 312 outputs an outcome based on the input parameters. In one aspect, CPU 312 is capable of providing automatic time passage which can be automatically timed or turn based on a predefined time duration.

The RCS system, in one embodiment, is able to create a game that is historically accurate and follows the actual historical events. For example, the RCS system provides computer simulation of historical war processes. To provide an RCS, various mathematical algorithms are used to calculate the chances of winning one or more battles based on a range of input parameters like, number of soldiers on both sides, level of training, morale, supply levels of ammunition and gasoline, surprise level, et cetera. To visualize a war theater, a set of interactive maps are used to reflect the progress of the game.

In one example, a battle algorithm uses at least partially Monte Carlo algorithm with a series of lookup tables for reading values or parameters and plots curves showing war theater. The curves represent relationship between various parts of parameters. For example, curves showing duration of a battle can be a function of ratio between two forces involved. The RCS further includes a large number of scenarios which can be described as "alternative history" scenarios which can be hypothetical possibilities that could change the historical events. For example, if a preemptive strike was initiated, the outcome of Yom Kippur war could be different.

An advantage of using an RCS system is that it presents a historical event or events that had happened. Another advantage is that the RCS system can be teaching tool or predicting tools to provide past, current, and future predictions based on the parameters.

Figure 4:
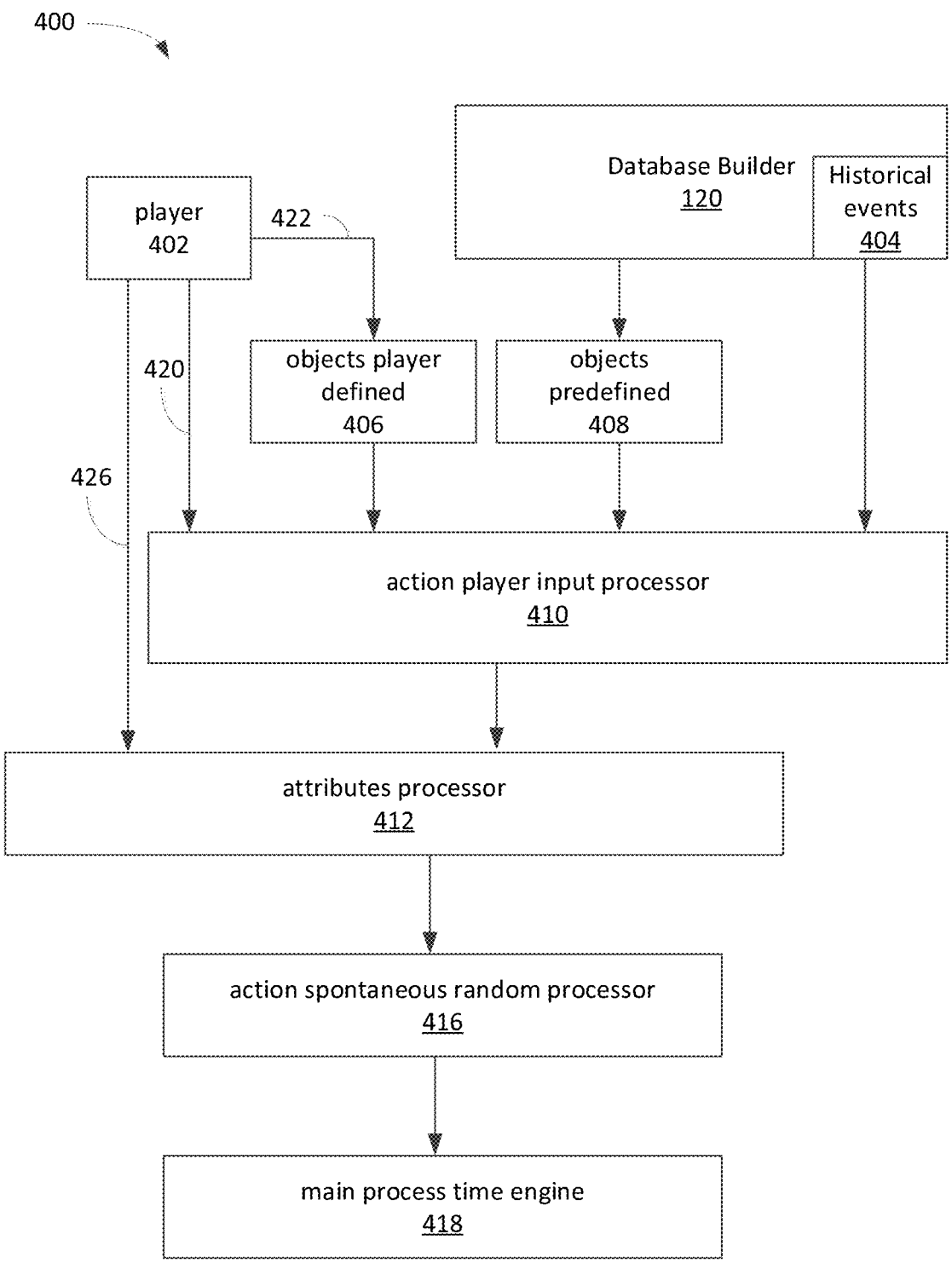
FIG. 4 is a logic block diagram illustrating an alternative logic flow for emulating RCS in accordance with one or more embodiments of the present invention.

FIG. 4 is a logic block diagram 400 illustrating an alternative logic flow for emulating RCS in accordance with one or more embodiments of the present invention. Diagram 400 includes database builder 120, action player input processor, 410, attributes processor 412, and player 402. Database builder 120, in one example, includes historical events and objects that are predefined for one or more RCSs. For instance, if a selected RCS is the second day of Yom Kippur war, time parameter which is predefined to be Oct. 7, 1973 is identified and fetched. It should be noted that the underlying concept of the exemplary embodiment(s) of the present invention would not change if one or more blocks (or networks) were added to or removed from diagram 400.

Player 402, also known as user, initiates an RCS as indicated by numeral 420 and enters a set of player-defined objects as indicated by numeral 422. After receipt of player 402 request for initiating the RCS, action player input processor 410 input obtains historical data or events 404 as simulation parameters from database builder 120. Upon obtaining player-defined objects 406 and objects predefined 408 from database builder 120, action player input processor 410 processes and forwards received data or parameters to attributes processor 412. Based on player or user input 426, attributes processor 412 processes and provides various processed parameters to action spontaneous random processor 416 in accordance player input 426, historical events 404, identified objects 406-408, and the like.

Action spontaneous random processor 416 initiates and processes game events autonomously using algorithms such as Monte Carlo method with or without players' input. After generating an outcome based on various processed parameters, the outcome is subsequently displayed to and/or communicated with player 402. After generating the outcome(s), the process proceeds to main process time engine 418. Depending on the applications and player's input(s), main process time engine 418 maintains and controls logic flow of the RCS or game.

Figure 5:
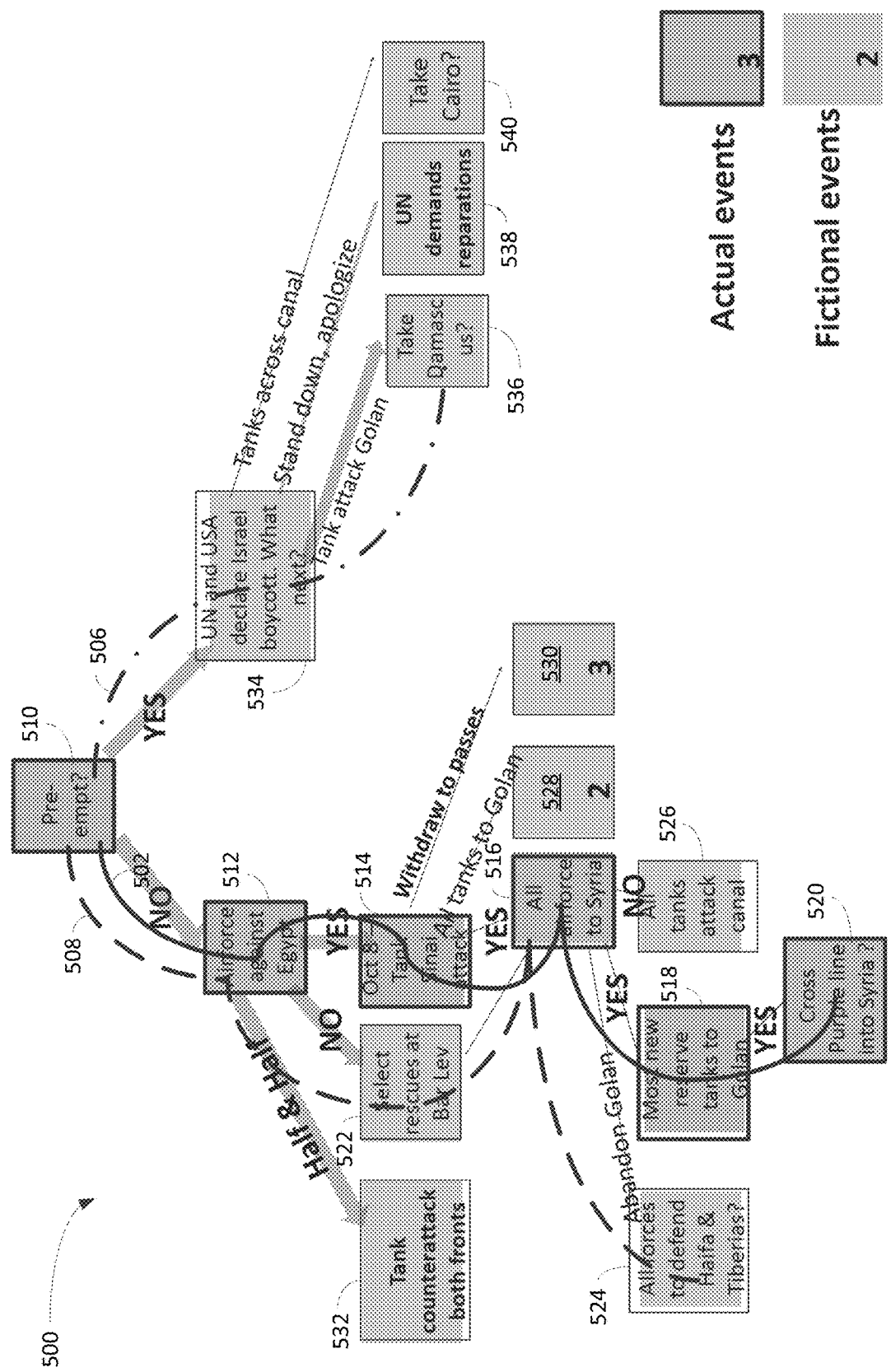
FIG. 5 is an event tree diagram illustrating an exemplary rail tree containing multiple rails for emulating RCS in accordance with one or more embodiments of the present invention.

FIG. 5 is an event tree diagram 500 illustrating an exemplary rail tree containing multiple rails for emulating RCS in accordance with one or more embodiments of the present invention. Diagram 500 illustrates multiple possible rails or paths from block 510 including rails 502-508. A rail can be referred to as a sequence of actual or potential events based on a predefined time frame. In one aspect, rail 502 is an actual event that had happened in the past. It should be noted that the underlying concept of the exemplary embodiment(s) of the present invention would not change if one or more blocks (or networks) were added to or removed from diagram 500.

In one aspect, rail 502 includes blocks 510-520 representing actual events. For instance, at block 510, a player decides whether a preempt strike should be launched before Oct. 6, 1973 assuming the RCS is Yom Kippur War. Upon entering a "NO" option by the player, the process proceeds to block 512 in which Israel Defense Force ("IDF") air force is activated against Egyptian force. After IDF tanks, at block 514, attack in Sinai if the player elects, IDF air force engages in Syria at block 516. Once the IDF reserved tanks, at block 518, enter Golan Heights on Egypt side, the IDF force, at block 520, crosses the border into Syria. It should be noted that a player is required to enter a selection at each block to move forward with RCS on a rail. Rail 502, in one aspect, is an actual historical recount of various events during Yom Kippur War.

Rail 506, in one example, illustrates a hypothetical or fictional path of events based on various parameters including experts' predictions and/or possibilities. Rail 506 includes blocks 510 and 534-536. For instance, at block 510, a player decides whether a preempt strike should be launched assuming the RCS is Yom Kippur War. Upon entering a "YES" option by the player, the process proceeds to block 510 in which IDF force launches a preemptive strike on Arab's forces. While, at block 534, the United Nations and the United States are likely to declare some kinds of boycott and/or sanctions, the IDF force is likely to take Golan Heights and Damascus using tanks and air force. Alternatively, the IDF force may send tanks across canal to reach Cairo at block 540 despite the boycotts by the UN and the US at block 534.

Rail 508, in one aspect, illustrates a hybrid path combining some actual events and some hypothetical events based on various parameters generated based on historical data as well as experts' predictions. For instance, at block 510, a player decides whether a preempt strike should be launched assuming the RCS is Yom Kippur War before Oct. 6, 1973. Upon entering a "NO" option by the player, the process proceeds to block 512 in which IDF air force decides not to engage against Egyptian force. After IDF, at block 514, selects to rescue and/or protect the Bar-Lev line, IDF air force engages in Syria at block 516. At block 524, the IDF, based on the player's selection, orders all force to defend Haifa and/or Tiberias. It should be noted that the player is required to enter a selection at each block to move forward with RCS. Rail 508 shows combination paths of some real events and some hypothetical events based on a historical data such as Yom Kippur War.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 6:
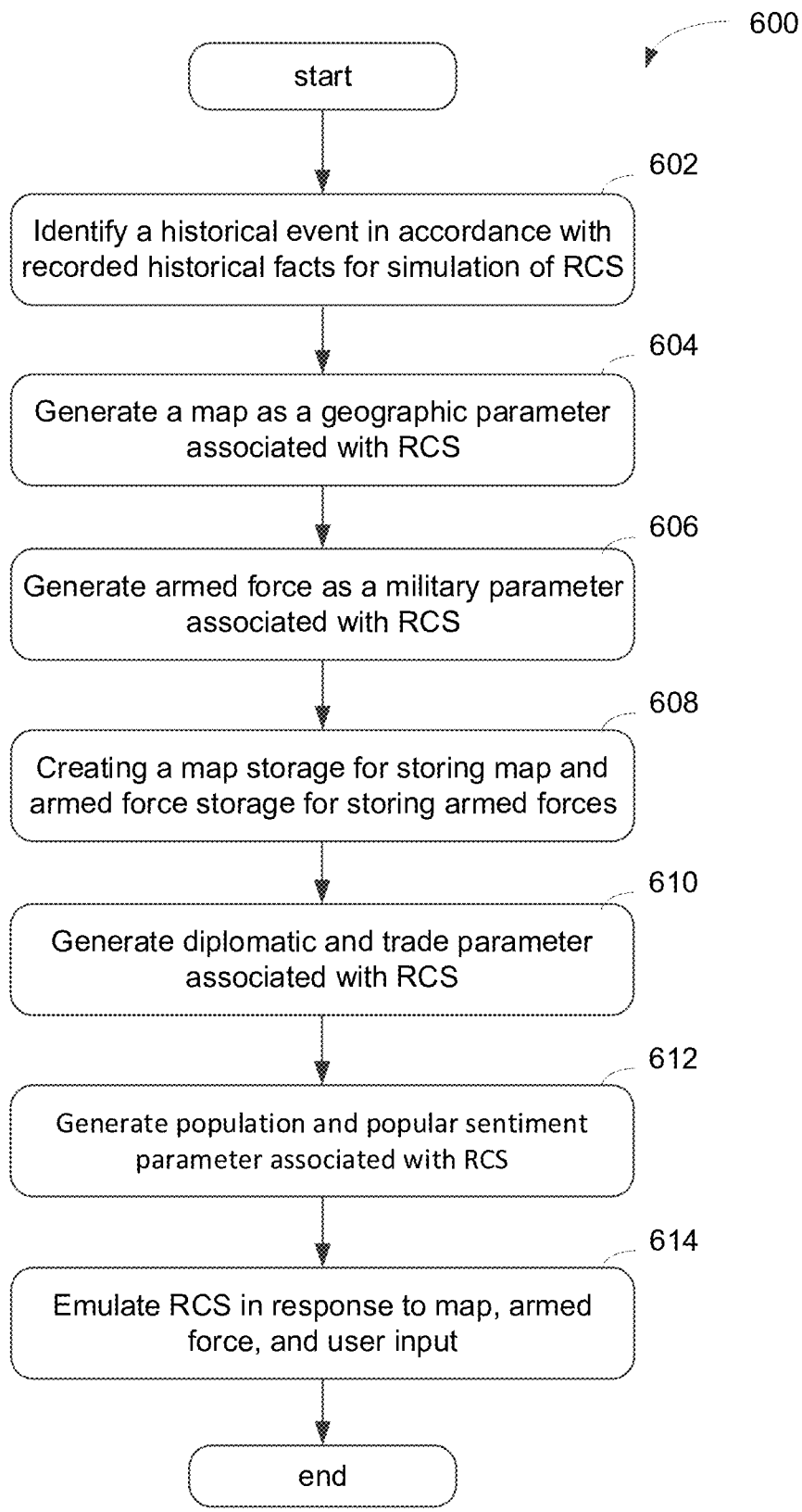
FIG. 6 is a flowchart illustrating an exemplary process of establishing a database for RCS in accordance with one or more embodiments of the present invention.

FIG. 6 is a flowchart 600 illustrating an exemplary process of establishing a database for RCS in accordance with one or more embodiments of the present invention. At block 602, a process, capable of facilitating an RCS based on at least a portion of historical event using a computer system such as an RCS system, is able to identify a first historical event in accordance with recorded historical facts for creating a first environment to simulate a first RCS. Note that the RCS system, for example, contains various specialized components and/or modules including a digital processor, memory, and network communication transceiver.

At block 604, a first map as a first geographic parameter associated with the first RCS is generated in accordance with historical geography relating to the first historical event. For example, the first map is updated in view of the geopolitical history.

At block 606, the first armed force as a military parameter associated with the first RCS is generated in accordance with the first historical event. In one embodiment, a set of military parameters representing various armed force, at block 606, is generated for war simulation or war game.

At block 608, the process is also able to create a first map storage for storing the first map and a first armed force storage for storing the first armed force. In one aspect, the process also generates diplomatic and trade parameters at block 610 as well as population and popular sentiment parameters associated with RCS at block 612. The diplomatic, trade, population, and popular sentiment parameters can also be used for emulating RCS.

At block 614, the first RCS is emulated in response to the first map, the first armed force, and the first user input. After generating first party parameter representing a first party and second party parameter representing a first opponent involved in the first historical event, the first RCS is simulated in accordance with the first- and second-party parameters. Upon generating a first culture trait associated with the first party and a second culture trait associated with the first opponent based on the first historical event, the first RCS is simulated in accordance with the first and second culture traits. It should be noted that the culture traits include, but not limited to, bravery, culture, tradition, religion, geographic, panicky, anxiety, and the like. After generating a first historic rail representing a sequence of historical battles based on the first historical event, the first RCS is simulated in accordance with the first historical rail and the first user input. For example, a rail representing a logic flow of sequences is created wherein one of the sequences represents a first historic rail and at least a portion of the logic flow sequences represents an optional rail. Upon generating a first optional rail representing a sequence of projected battles based on the first historical event and a database of study relating to the first historical event, the first RCS is simulated in accordance with the first optional rail and the first user input. The process is also capable of calculating a numerical result representing a possible outcome of a military battle utilizing an algorithm of random repetitive samplings based on the first map, first armed force, the first party parameter, the first user input, and the second party parameter.

Figure 7:
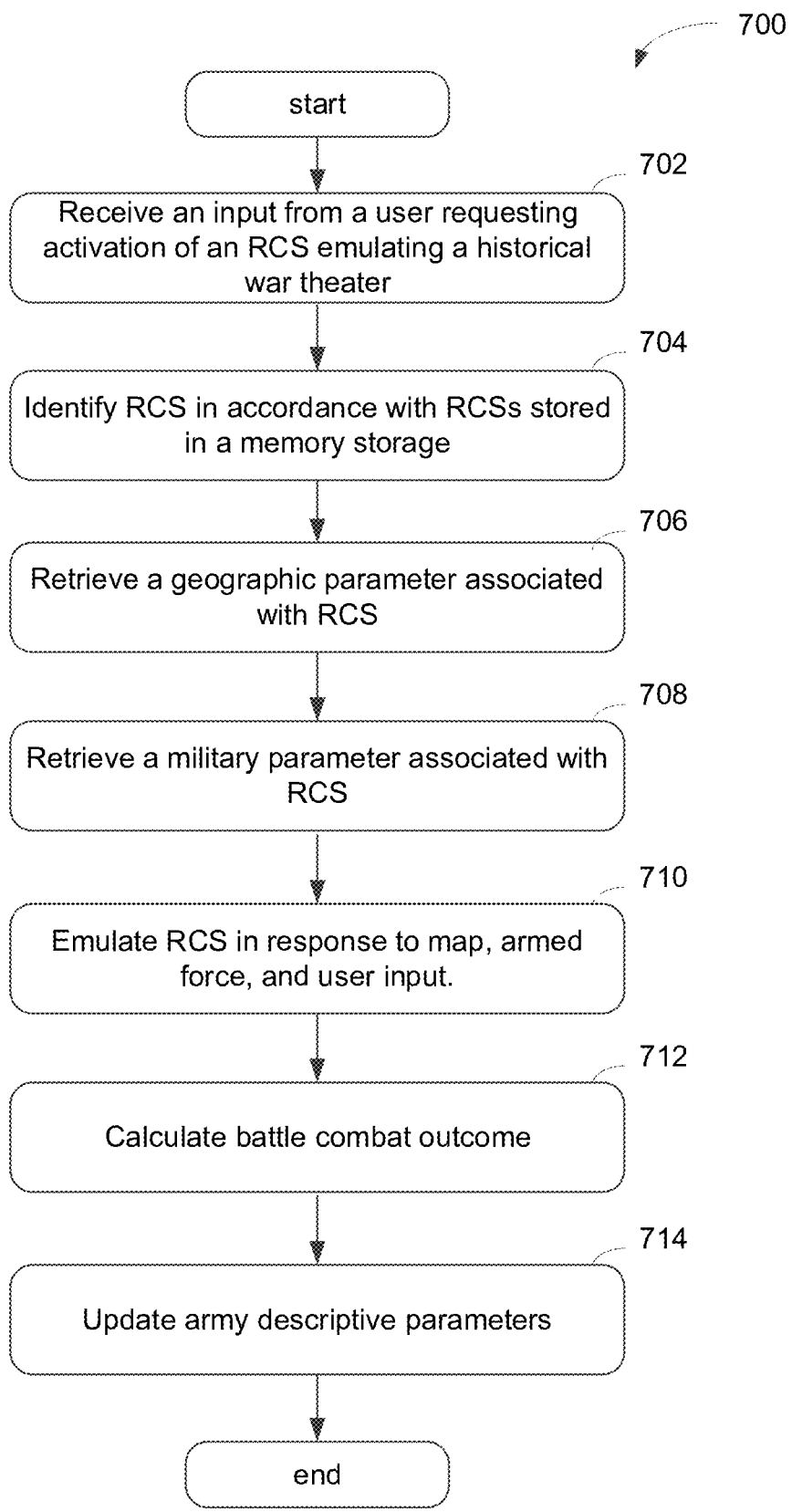
FIG. 7 is a flowchart illustrating an exemplary process of emulating RCS in view of predefined parameters and user input in accordance with one embodiment of the present invention.

FIG. 7 is a flowchart 700 illustrating an exemplary process of emulating RCS in view of predefined parameters and user input in accordance with one embodiment of the present invention. At block 702, a process of facilitating an RCS based on at least a portion of historical event receives a first input from a first user requesting activation of a first RCS emulating a historical war theater with at least a portion of historical facts.

At block 704, the first RCS is identified in accordance with multiple RCSs stored in a memory storage via an RCS locating circuitry. For example, the RCS locating circuitry or RCS locator is capable of identifying Yom Kippur war as the first RCS and downloading various factual data associated with Yom Kippur war for simulation.

At block 706, after retrieving, from a map database, a first map as a first geographic parameter associated with the first RCS in accordance with historical geography relating to the first historical event, a first armed force, at block 708, is retrieved from an armed force database as a military parameter associated with the first RCS in accordance with the first historical event.

At block 710, the first RCS is emulated in response to the first map, the first armed force, and the first user input. In one aspect, the process actives a mathematic algorithm such as Monte Carlo method to calculate an outcome of a battle or combat at block 712. At block 714, the army descriptive parameters, such as soldiers' moral, training, rest, ammunition supply, and/or fuel remaining are updated for the next move or turn. In one embodiment, after loading, from a party database, a first party parameter representing a first party involved in the first historical event, the first RCS is simulated in accordance with the first party parameter. In addition, upon retrieving, from a culture database, a first culture trait associated with the first party based on the first historical event, the first RCS is simulated in accordance with the first culture trait. Furthermore, the process is capable of calculating a numerical result representing a possible outcome of a military battle utilizing an algorithm of random repetitive samplings based on a map of middle east, Israeli force, Arab force, United States force, Soviet Union force, and the first user input during simulation of the war theater involving Yom Kippur war. After receiving a second input from a second user requesting activation of a second RCS emulating a historical war theater with at least a portion of historical facts, the second RCS is identified in accordance with the plurality of RCSs stored in the memory storage. Upon retrieving, from a map database, a second map as a second geographic parameter associated with the second RCS in accordance with historical geography relating to the second historical event, a second armed force is retrieved from an armed force database as a second military parameter associated with the second RCS in accordance with the second historical event. In one aspect, the process emulates the second RCS in response to the second map, the second armed force, and the second user input.

Figure 8:
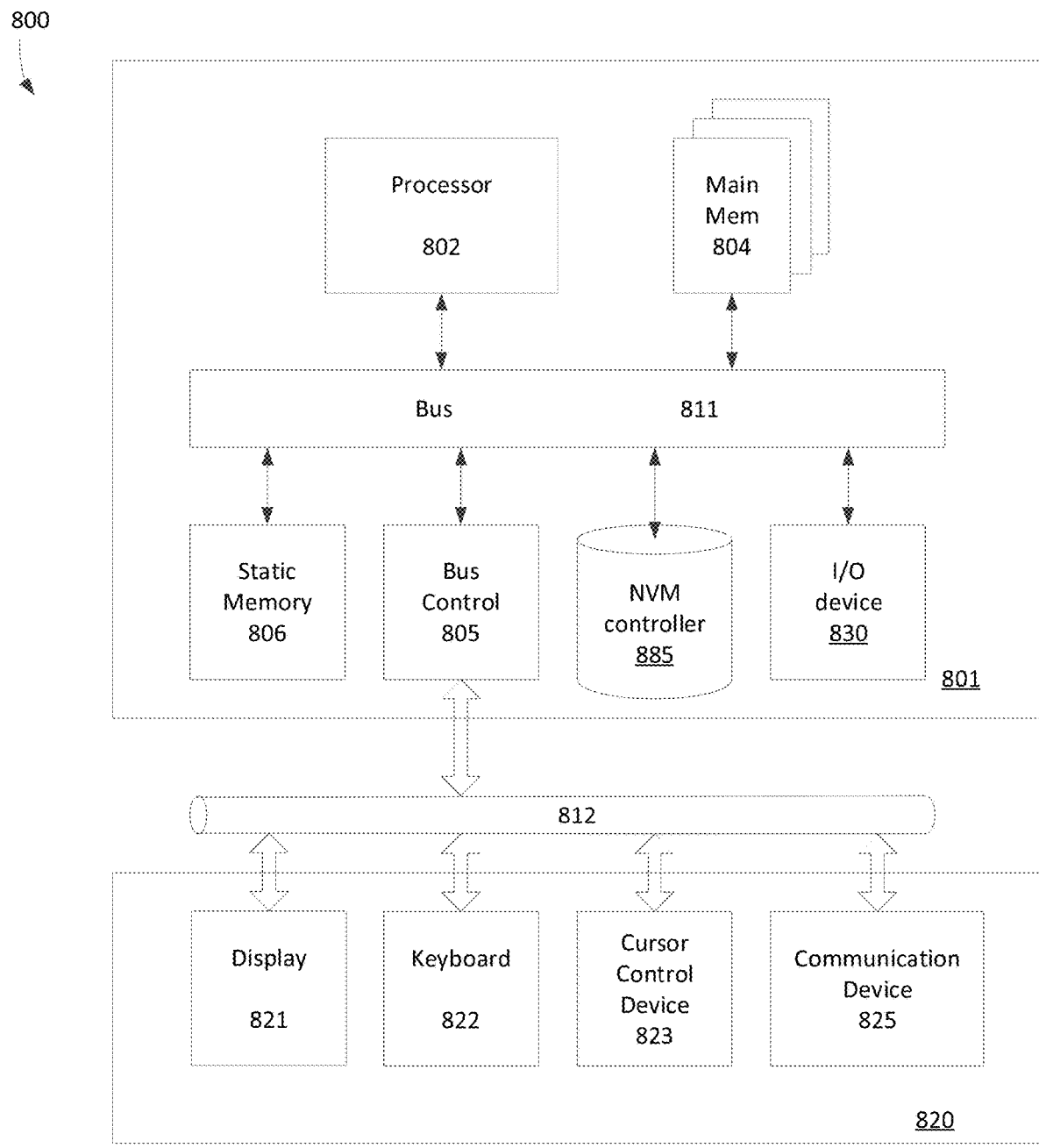
FIG. 8 is a block diagram illustrating a digital processing system capable of being configured to be RCS system, database builder, and/or simulation allocator in accordance with one or more embodiments of the present invention.

FIG. 8 is a block diagram 800 illustrating a digital processing system capable of being configured to be RCS system, database builder, and/or simulation allocator in accordance with one or more embodiments of the present invention. Computer system 800 can include a processing unit 801, an interface bus 812, and an input/output ("IO") unit 820. Processing unit 801 includes a processor 802, main memory 804, system bus 811, static memory device 806, bus control unit 805, I/O element 830, and NVM controller 885. It should be noted that the underlying concept of the exemplary embodiment(s) of the present invention would not change if one or more blocks (circuit or elements) were added to or removed from FIG. 8.

Bus 811 is used to transmit information between various components and processor 802 for data processing. Processor 802 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 804, which may include multiple levels of cache memories, stores frequently used data and instructions. Main memory 804 may be RAM (random access memory), MRAM (magnetic RAM), or flash memory. Static memory 806 may be a ROM (read-only memory), which is coupled to bus 811, for storing static information and/or instructions. Bus control unit 805 is coupled to buses 811-812 and controls which component, such as main memory 804 or processor 802, can use the bus. Bus control unit 805 manages the communications between bus 811 and bus 812. Mass storage memory or SSD which may be a magnetic disk, an optical disk, hard disk drive, floppy disk, CD-ROM, and/or flash memories are used for storing large amounts of data.

I/O unit 820, in one embodiment, includes a display 821, keyboard 822, cursor control device 823, and communication device 825. Display device 821 may be a liquid crystal device, cathode ray tube ("CRT"), touch-screen display, or other suitable display device. Display 821 projects or displays images of a graphical planning board. Keyboard 822 may be a conventional alphanumeric input device for communicating information between computer system 800 and computer operator(s). Another type of user input device is cursor control device 823, such as a conventional mouse, touch mouse, trackball, or other type of cursor for communicating information between system 800 and user(s).

Communication device 825 is coupled to bus 811 for accessing information from remote computers or servers, such as server or other computers, through wide-area network. Communication device 825 may include a modem or a network interface device, or other similar devices that facilitate communication between computer 800 and the network. Computer system 800 may be coupled to a number of servers via a network infrastructure such as the infrastructure illustrated in FIG. 1.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method for facilitating a resource confined simulation ("RCS") based on at least a portion of historical event via a computer system containing a digital processor, memory, and network communication transceiver, the method comprising:
   identifying a first historical event in accordance with recorded historical facts for creating a first environment to simulate a first RCS;
   generating a first map as a first geographic parameter associated with the first RCS in accordance with historical geography relating to the first historical event;
   generating first armed force as a military parameter associated with the first RCS in accordance with the first historical event;
   creating a first map storage for storing the first map and a first armed force storage for storing the first armed force;
   emulating the first RCS in response to the first map, the first armed force, and first user input;
   generating a first party parameter representing a first party involved in the first historical event;
   generating a second party parameter representing a first opponent involved in the first historical event;
   generating a second culture trait associated with the first opponent based on the first historical event;
   generating a first historic rail representing a sequence of historical battles based on the first historical event; and
   simulating the first RCS in accordance with the first party parameter, the second party parameter, the second culture trait, the first historical rail and the first user input.

2. The method of claim 1, further comprising:
   generating a first culture trait associated with the first party based on the first historical event; and
   simulating the first RCS in accordance with the first culture trait.

3. The method of claim 1, further comprising calculating a numerical result representing a possible outcome of a military battle utilizing an algorithm of random repetitive samplings based on the first map, first armed force, the first party parameter, the first user input, and the second party parameter during simulation of the first RCS.

4. The method of claim 1, wherein generating a first historic rail includes creating a plurality of logic flow sequences wherein one of the plurality of logic flow sequences represents a first historic rail and at least a portion of the plurality of logic flow sequences represents a first optional rail.

5. A method for facilitating a resource confined simulation ("RCS") based on at least a portion of historical event via a computer system containing a digital processor, memory, and network communication transceiver, the method comprising:
   identifying a first historical event in accordance with recorded historical facts for creating a first environment to simulate a first RCS;
   generating a first map as a first geographic parameter associated with the first RCS in accordance with historical geography relating to the first historical event;
   generating first armed force as a military parameter associated with the first RCS in accordance with the first historical event;
   creating a first map storage for storing the first map and a first armed force storage for storing the first armed force;
   emulating the first RCS in response to the first map, the first armed force, and first user input;
   generating a first party parameter representing a first party involved in the first historical event;
   generating second party parameter representing a first opponent involved in the first historical event;
   generating a second culture trait associated with the first opponent based on the first historical event;
   generating a first optional rail representing a sequence of projected battles based on the first historical event and a database of study relating to the first historical event; and
   simulating the first RCS in accordance with the first party parameter, the second party parameter, the second culture trait, the first optional rail and the first user input.

6. The method of claim 5, further comprising:
   generating a first culture trait associated with the first party based on the first historical event; and
   simulating the first RCS in accordance with the first culture trait.

7. The method of claim 5, further comprising calculating a numerical result representing a possible outcome of a military battle utilizing an algorithm of random repetitive samplings based on the first map, first armed force, the first party parameter, the first user input, and the second party parameter during simulation of the first RCS.

8. The method of claim 5, wherein generating a first historic rail includes creating a plurality of logic flow sequences wherein one of the plurality of logic flow sequences represents a first historic rail and at least a portion of the plurality of logic flow sequences represents the first optional rail.

9. A system configured to facilitate a resource confined simulation ("RCS") based on at least a portion of historical event, comprising:
   a plurality of user controllers configured to receive user inputs via one or more user connected consoles for facilitating simulation a first RCS;
   a map database coupled to the plurality of user controllers and configured to store a first map representing a first geography associated with the first RCS in accordance with historical geography relating to the first historical event;
   an armed force database coupled to the map database and configured to store first armed force as a military parameter associated with the first RCS in accordance with historical data;
   a digital processor coupled to the map database and configured to generate numerical results based on repeated random sampling, the digital processor configured to emulate the first RCS utilizing the numerical results in response to the first map, the first armed force, and first user input; and
   a rail database coupled to the digital processor and configured to store a plurality of logic flow sequences wherein one of the plurality of logic flow sequences represents a first historic rail and at least a portion of the plurality of logic flow sequences represents a first optional rail.

10. The system of claim 9, further comprising a party database coupled to the digital processor and configured to store data relating to a first party involved in the first historical event for simulating the first RCS.

11. The system of claim 9, further comprising a culture characteristic database coupled to the digital processor and configured to store data relating to a first culture trait based on the first historical event for simulating the first RCS.

12. The system of claim 9, further comprising a database controller coupled to the digital processor and configured to obtain and establish a set of predefined data based on at least a portion of the first historical event for facilitating simulation of the first RCS.

\* \* \* \* \*